(12) United States Patent
Chen et al.

(10) Patent No.: US 8,253,160 B2
(45) Date of Patent: Aug. 28, 2012

(54) LIGHT-EMITTING DIODE CHIP STRUCTURE AND FABRICATION METHOD THEREOF

(75) Inventors: Jun-Rong Chen, Taichung (TW); Chi-Wen Kuo, Tainan (TW); Kun-Fu Huang, Miaoli County (TW); Jui-Yi Chu, Taichung County (TW); Kuo-Lung Fang, Hsinchu County (TW)

(73) Assignee: Lextar Electronics Corp., Hsinchu (TW)

( * ) Notice: Subject to any disclaimer, the term of this patent is extended or adjusted under 35 U.S.C. 154(b) by 19 days.

(21) Appl. No.: 13/050,677

(22) Filed: Mar. 17, 2011

(65) Prior Publication Data
US 2012/0153339 A1  Jun. 21, 2012

(30) Foreign Application Priority Data
Dec. 21, 2010  (TW) ............................... 99144955 A

(51) Int. Cl.
*H01L 33/20*  (2010.01)
(52) U.S. Cl. .................. 257/99; 257/E33.006; 438/34; 438/41; 438/44
(58) Field of Classification Search .................. 438/34, 438/41, 44; 257/99, E33.006
See application file for complete search history.

(56) References Cited

U.S. PATENT DOCUMENTS

| | | |
|---|---|---|
| 6,459,100 B1 | 10/2002 | Doverspike et al. |
| 6,599,361 B2 * | 7/2003 | Tang et al. ........................ 117/84 |
| 6,599,364 B2 | 7/2003 | Mendez-Gallon |
| 7,259,399 B2 | 8/2007 | Lee et al. |
| 7,361,521 B2 | 4/2008 | Oh et al. |
| 7,462,867 B2 * | 12/2008 | Tezen .............................. 257/79 |
| 7,569,865 B2 | 8/2009 | Lee et al. |
| 7,573,076 B2 * | 8/2009 | Baik et al. ..................... 257/103 |
| 8,004,055 B2 * | 8/2011 | Wells ............................. 257/428 |
| 2003/0143771 A1 * | 7/2003 | Kidoguchi et al. ............. 438/46 |
| 2011/0233734 A1 * | 9/2011 | Wells ............................. 257/618 |

FOREIGN PATENT DOCUMENTS
TW  200717875  5/2007

* cited by examiner

Primary Examiner — George Fourson, III
(74) Attorney, Agent, or Firm — Thomas |Kayden

(57) ABSTRACT

A light-emitting diode chip structure including a conductive substrate, a semiconductor stacking layer and a patterned seed crystal layer is provided. The conductive substrate has a surface. The surface has a first region and a second region alternately distributed over the surface. The semiconductor stacking layer is disposed on the conductive substrate, and the surface of the conductive substrate faces the semiconductor stacking layer. The patterned seed crystal layer is disposed on the first region of the surface of the conductive substrate and between the conductive substrate and the semiconductor stacking layer. The patterned seed crystal layer separates the semiconductor stacking layer from the first region. The semiconductor stacking layer covers the patterned seed crystal layer and the second region, and is electrically connected to the conductive substrate through the second region. A fabrication method of the light-emitting diode chip structure is also provided.

18 Claims, 6 Drawing Sheets

100A

100B

LIGHT-EMITTING DIODE CHIP STRUCTURE AND FABRICATION METHOD THEREOF

CROSS-REFERENCE TO RELATED APPLICATION

This application claims the priority benefit of Taiwan application serial no. 99144955, filed Dec. 21, 2010. The entirety of the above-mentioned patent application is hereby incorporated by reference herein and made a part of this specification.

BACKGROUND OF THE INVENTION

1. Field of the Invention

The invention generally relates to a chip structure and a fabrication method thereof, in particular, to a light-emitting diode (LED) chip structure and a fabrication method thereof.

2. Description of Related Art

A light-emitting diode (LED) is a semiconductor element. The material for forming a light-emitting chip of the LED mainly employs a compound of III-V group chemical elements, for example, gallium phosphide (GaP), gallium nitride (GaN), or gallium arsenide (GaAs). The light-emitting principle of the LED is converting electric energy into optical energy. Specifically, a current is applied to a compound semiconductor of the LED, so as to release energy in the form of light through the combination of electrons and electron holes. Since the light-emitting phenomenon of the LED is not caused by heating or discharging, the service life of the LED is more than 100,000 hours. In addition, the LED has advantages such as fast response, small volume, low power consumption, low pollution, high reliability, and applicability to mass production. Therefore, the application of the LED is very broad and includes, for example, light sources of large-scale billboards, traffic lights, cell phones, scanners, light sources of faxes, and flat lighting devices. In recent years, the LED has a developing trend to be main indoor illuminators.

Taking a GaN LED as an example, the GaN LED has different forms of structures, one of which is a mesa-structure GaN LED. In the mesa-structure GaN LED, two electrodes thereof are located on the same side of the mesa-structure GaN LED, and therefore a phenomenon that the current is concentrated in one region is likely to appear, causing problems such as non-uniform light emission and poor heat dissipation efficiency in the mesa-structure GaN LED. Therefore, a vertical type GaN LED is provided in the prior art for solving the problems. However, a fabrication process of the vertical type GaN LED is complex, and a laser lift-off process technology having high technical thresholds is required, thus making the fabrication cost of the vertical type GaN LED high.

SUMMARY OF THE INVENTION

Accordingly, the invention is directed to an LED chip structure, which has good optical properties and a low fabrication cost, and is unlikely to have the problem of overly concentrated heating region.

The invention is directed to a fabrication method of an LED chip structure, which is simple and has a low cost.

An embodiment of the invention provides an LED chip structure, which includes a conductive substrate, a semiconductor stacking layer, and a patterned seed crystal layer. The conductive substrate has a surface, and the surface has a first region and a second region, wherein the first region and the second region are alternately distributed over the surface. The semiconductor stacking layer is disposed on the conductive substrate, and the surface of the conductive substrate faces the semiconductor stacking layer. The patterned seed crystal layer is disposed on the first region of the surface of the conductive substrate and between the conductive substrate and the semiconductor stacking layer, wherein the patterned seed crystal layer separates the first region from the semiconductor stacking layer, and exposes the second region, and the semiconductor stacking layer covers the patterned seed crystal layer and the second region, and is electrically connected to the conductive substrate through the second region.

An embodiment of the invention provides a fabrication method of an LED chip structure. The fabrication method includes the following steps. A conductive substrate is provided, wherein the conductive substrate has a surface, the surface has a first region and a second region, and the first region and the second region are alternately distributed over the surface. A patterned seed crystal layer is formed on the first region, with the second region exposed by the patterned seed crystal layer. A semiconductor stacking layer is formed on the conductive substrate and the patterned seed crystal layer, wherein the semiconductor stacking layer covers the patterned seed crystal layer and the second region, the patterned seed crystal layer separates the first region from the semiconductor stacking layer, and the semiconductor stacking layer is electrically connected to the conductive substrate through the second region.

Based on the above, the LED chip structure according to the embodiment of the invention employs the patterned seed crystal layer, and the semiconductor stacking layer is grown from the patterned seed crystal layer, and therefore, the LED chip structure has good epitaxial quality. In addition, since the patterned seed crystal layer does not completely cover the surface of the conductive substrate, and exposes the second region to enable the semiconductor stacking layer to be electrically connected to the conductive substrate, a current in the LED chip structure is not overly concentrated, and thereby the LED chip structure has good optical properties and is unlikely to have the problem that the heating region is overly concentrated.

In addition, since the fabrication method of the LED chip structure according to the embodiment of the invention employs the patterned seed crystal layer, instead of forming the semiconductor stacking layer with good quality through a temporary substrate, the semiconductor stacking layer with good quality can be grown on the conductive substrate, and therefore, a fabrication process of the LED chip structure is simple and has a low cost.

In order to make the aforementioned features and advantages of the invention comprehensible, embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
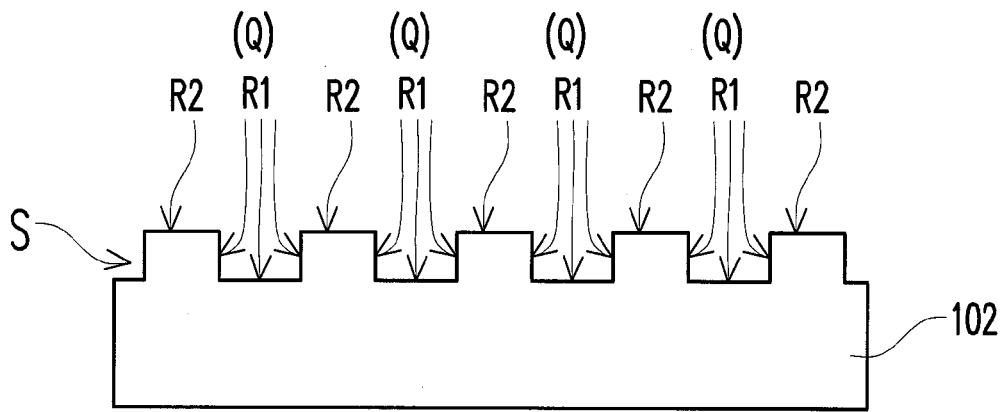
FIGS. 1A to 1E are schematic views illustrating a fabrication process of an LED chip structure according to a first embodiment of the invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIGS. 1A to 1E are schematic sectional views illustrating a fabrication process of an LED chip structure 100 according to a first embodiment of the invention. Referring to FIG. 1A, first, a conductive substrate 102 is provided, wherein the conductive substrate 102 has a surface S, the surface S has a first region R1 and a second region R2, and the first region R1 and the second region R2 are alternately distributed over the surface S. In this embodiment, the first regions R1 are uniformly distributed on the surface S of the conductive substrate 102, a second region R2 exists between two first regions R1, and the first region R1 is substantially connected to the second region R2. Shapes and areas (ratio) of the first region R1 and the second region R2 may be properly designed according to actual product requirements.

Specifically, the step of providing the conductive substrate 102 may include selectively etching the conductive substrate 102, and obtaining by etching a recess region Q on the conductive substrate 102 so as to form the first region R1. The first region R1 in this embodiment is, for example, a rectangular recess region; however, the invention is not limited to this. In other embodiments, the first region R1 may be a polygonal recess region, a circular recess region, or a recess region of other suitable shapes. A material of the conductive substrate 102 may be n-type doped silicon (n-Si), n-type doped silicon carbide (n-SiC), n-type doped gallium arsenide (n-GaAs), any p-type doped semiconductor, metal, metal oxide, or metal nitride, or other proper conductive materials.

Figure 1B:
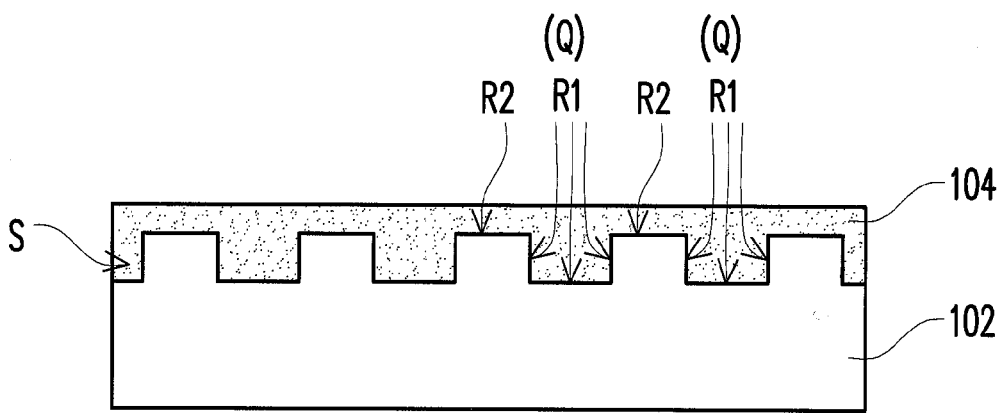

Next, a patterned seed crystal layer 104a is formed on the first region R1, with the second region R2 exposed by the patterned seed crystal layer 104a. For example, a blanket seed crystal layer 104 may be formed on the surface S of the conductive substrate 102 first, with the recess region Q filled by the blanket seed crystal layer 104. In this embodiment, the blanket seed crystal layer 104 fills up the entire recess region Q (the first region R1), and at the same time, the seed crystal layer 104 also covers the second region R2, as shown in FIG. 1B. A method for forming the blanket seed crystal layer 104 may be a physical vapor deposition (PVD) method; however, the invention is not limited to this. In other embodiments, other methods may be employed to form the blanket seed crystal layer 104.

Figure 1C:
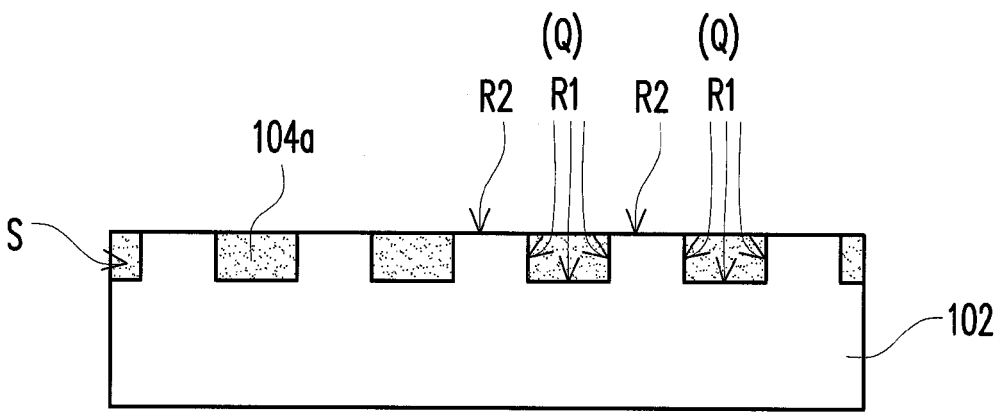

Then, a top portion of the blanket seed crystal layer 104 is removed, so as to expose the second region R2 and form the patterned seed crystal layer 104a, as shown in FIG. 1C. For example, in this embodiment, the top portion of the seed crystal layer 104 may be removed by a mechanical polishing or chemical-mechanical polishing method, or by using a common method of combining a mask with photolithography, so as to expose the second region R2 and form the patterned seed crystal layer 104a. However, the invention is not limited to this. In other embodiments, other methods may be employed to remove the top portion of the seed crystal layer 104.

In this embodiment, the patterned seed crystal layer 104a is embedded in the recess region Q. The function of the patterned seed crystal layer 104a is to enable a semiconductor stacking layer 106 to be formed subsequently to have good epitaxial quality. Therefore, the material of the patterned seed crystal layer 104a may be properly selected according to the material of the semiconductor stacking layer 106. For example, when the semiconductor stacking layer 106 to be formed subsequently is a GaN stacking layer, the material of the patterned seed crystal layer 104a may be GaN, AlN, AlGaN, or other suitable materials. In this embodiment, the material of the patterned seed crystal layer 104a is, for example, an insulating material.

Figure 1D:
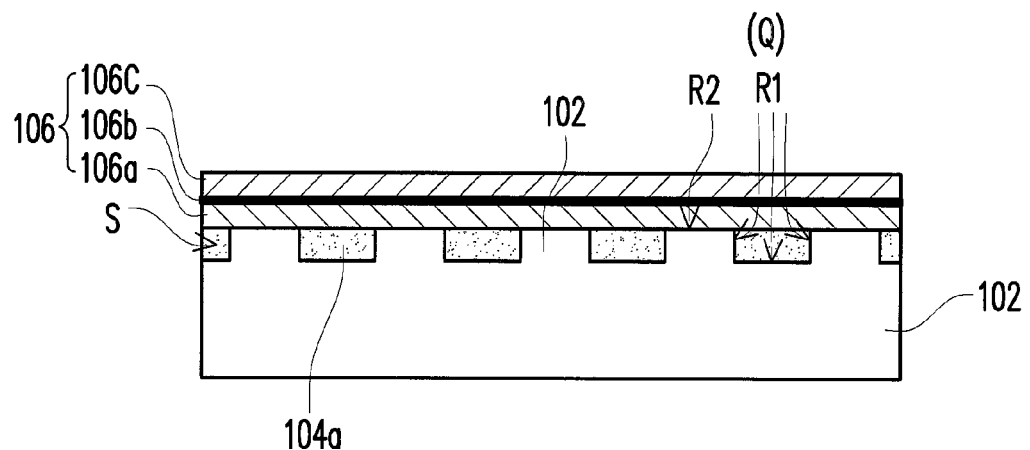

Then, referring to FIG. 1D, the semiconductor stacking layer 106 is formed on the conductive substrate 102 and the patterned seed crystal layer 104a, wherein the semiconductor stacking layer 106 covers the patterned seed crystal layer 104a and the second region R2, the patterned seed crystal layer 104a separates the first region R1 from the semiconductor stacking layer 106, and the semiconductor stacking layer 106 is electrically connected to the conductive substrate 102 through the second region R2. In this embodiment, the step of forming the semiconductor stacking layer 106 may be as follows. First, a first doped type semiconductor layer 106a is formed on the conductive substrate 102, with the patterned seed crystal layer 104a and the second region R2 covered by the first doped type semiconductor layer 106a. Then, a light-emitting layer 106b is formed on the first doped type semiconductor layer 106a. Afterwards, a second doped type semiconductor layer 106c is formed on the light-emitting layer 106b. In this embodiment, the first doped type semiconductor layer 106a is, for example, an n-type GaN (n-GaN) layer; the light-emitting layer 106b is, for example, a quantum well layer; and the second doped type semiconductor layer 106c is, for example, a p-type GaN (p-GaN) layer. In other embodiments, the first doped type semiconductor layer 106a may be a p-GaN layer, and the second doped type semiconductor layer 106c may be an n-GaN layer.

It should be noted that, in the fabrication method of the LED chip structure 100 according to this embodiment, the patterned seed crystal layer 104a may enable the semiconductor stacking layer 106 on the conductive substrate 102 to have good epitaxial quality, and meanwhile, the semiconductor stacking layer 106 may be enabled to be electrically connected to the conductive substrate 102 through the second region R2. In this manner, the LED chip structure 100 of this embodiment does not need a temporary substrate in the prior art to perform epitaxy, and the step of transferring and attaching the seed crystal layer and the semiconductor stacking layer to the conductive substrate can be omitted. In addition, the laser lift-off process technology having high technical thresholds is not needed to lift off the temporary substrate. Therefore, the fabrication cost of the LED chip structure 100 of this embodiment is dramatically reduced. In addition, the fabrication method of the LED chip structure 100 of this embodiment is simple, which facilitates improving a fabrication yield of the LED chip structure 100.

Figure 1E:
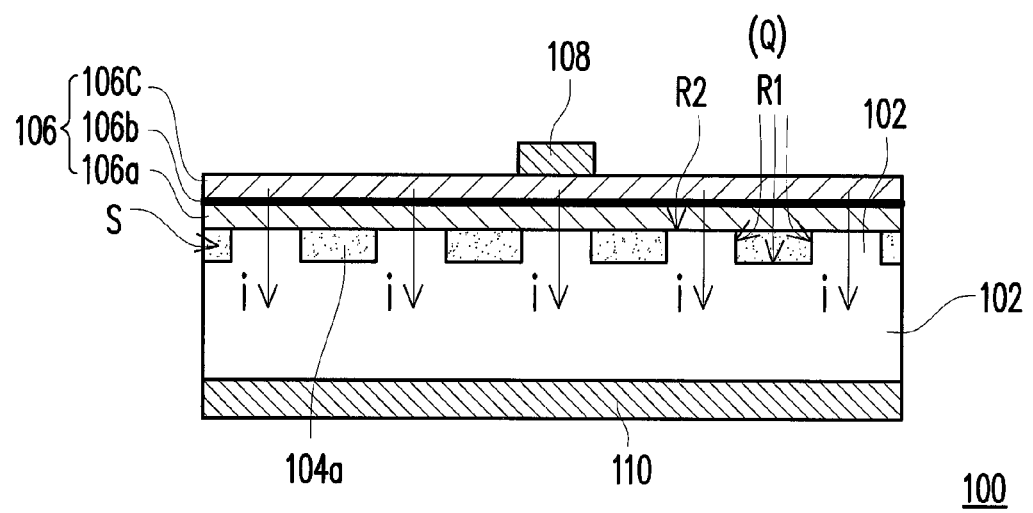

Further, referring to FIG. 1E, the fabrication method of the LED chip structure 100 of this embodiment may further include forming a first electrode 108 on the semiconductor stacking layer 106, wherein the semiconductor stacking layer 106 is disposed between the first electrode 108 and the conductive substrate 102. In this manner, the LED chip structure 100 of this embodiment can enable the light-emitting layer 106b in the semiconductor stacking layer 106 to emit light through the first electrode 108 and the second region R2 of the conductive substrate 102. A second electrode 110 may also be formed on the conductive substrate 102, wherein the surface S of the conductive substrate 102 faces away from the second electrode 110, so that a current i of the LED chip structure 100 of this embodiment flows through the first electrode 108, the semiconductor stacking layer 106, the second region R2, the conductive substrate 102, and the second electrode 110, thereby driving the semiconductor stacking layer 106 to emit light. Then, the LED chip structure 100 of this embodiment is completed.

It should be noted that, the LED chip structure 100 of this embodiment is driven through a plurality of second regions R2 distributed at various parts of the surface S of the conductive substrate 102. In other words, the current i driving the LED chip structure 100 is distributed at various parts of the surface S of the conductive substrate 102. Therefore, the LED chip structure 100 of this embodiment is unlikely to have the problems in the prior art that an LED chip structure has poor light-emitting properties, low degree of light emission uniformity, and poor heat dissipation efficiency since the current and the heating region in a mesa-structure LED are overly concentrated.

FIG. 1E is a schematic sectional view of an LED chip structure 100 according to an embodiment of the invention. Referring to FIG. 1E, the LED chip structure 100 of this embodiment includes a conductive substrate 102, a semiconductor stacking layer 106, and a patterned seed crystal layer 104a. The conductive substrate 102 has a surface S, wherein the surface S has a first region R1 and a second region R2, and the first region R1 and the second region R2 are alternately distributed over the surface S. The semiconductor stacking layer 106 is disposed on the conductive substrate 102, and the surface S of the conductive substrate 102 faces the semiconductor stacking layer 106. The patterned seed crystal layer 104a is disposed on the first regions R1 of the surface S of the conductive substrate and between the conductive substrate 102 and the semiconductor stacking layer 106, wherein the patterned seed crystal layer 104a separates the first region R1 from the semiconductor stacking layer 106, and exposes the second region R2, and the semiconductor stacking layer 106 covers the patterned seed crystal layer 104a and the second region R2, and is electrically connected to the conductive substrate 102 through the second region R2.

The semiconductor stacking layer 106 of the LED chip structure 100 of this embodiment may include a first doped type semiconductor layer 106a, a light-emitting layer 106b, and a second doped type semiconductor layer 106c. The first doped type semiconductor layer 106a is disposed on the conductive substrate 102, and covers the patterned seed crystal layer 104a and the second region R2. The light-emitting layer 106b is disposed on the first doped type semiconductor layer 106a. The second doped type semiconductor layer 106c is disposed on the light-emitting layer 106b.

The LED chip structure 100 of this embodiment may further include a first electrode 108 and a second electrode 110. The first electrode 108 is disposed on the semiconductor stacking layer 106, wherein the semiconductor stacking layer 106 is disposed between the first electrode 108 and the conductive substrate 102. The second electrode 110 is disposed on the conductive substrate 102, wherein the conductive substrate 102 is disposed between the second electrode 110 and the semiconductor stacking layer 106.

Second Embodiment

FIGS. 2A to 2E are schematic sectional views illustrating a fabrication process of an LED chip structure 100A according to a second embodiment of the invention. The LED chip structure 100A and the fabrication process thereof in this embodiment are similar to the LED chip structure 100 and the fabrication process thereof in the first embodiment, and thus like elements are indicated by like reference numerals. Hereinafter, differences between the two embodiments are illustrated, and the similarities will not be described again.

Figure 2A:
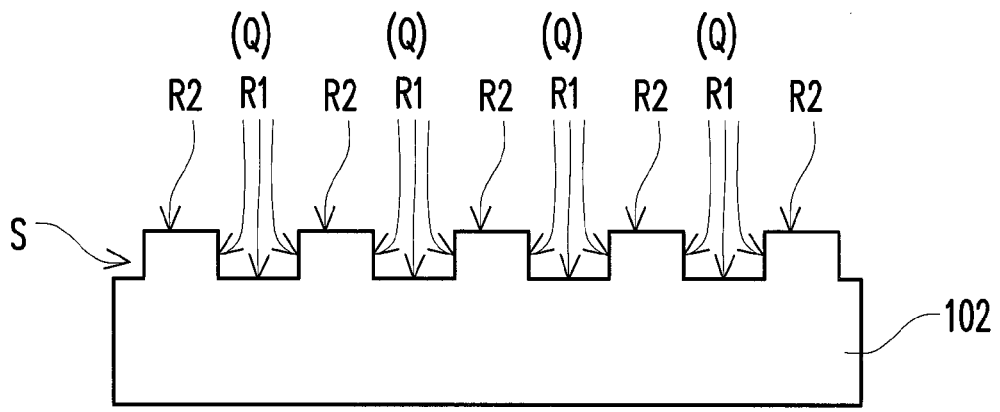
FIGS. 2A to 2E are schematic views illustrating a fabrication process of an LED chip structure according to a second embodiment of the invention.

Referring to FIG. 2A, first, a conductive substrate 102 is provided, wherein the conductive substrate 102 has a surface S, the surface S has a first region R1 and a second region R2, and the first region R1 and the second region R2 are alternately distributed over the surface S. Specifically, the step of providing the conductive substrate 102 may include selectively etching the conductive substrate 102, and obtaining by etching a recess region Q on the conductive substrate 102 to form the first region R1.

Figure 2B:
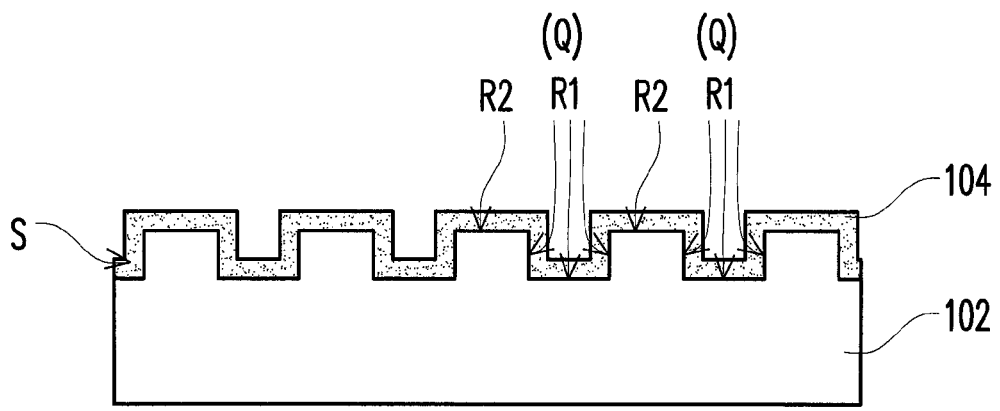

Next, a patterned seed crystal layer 104a is formed on the first region R1, with the second region R2 exposed by the patterned seed crystal layer 104a. For example, a blanket seed crystal layer 104 may be formed on the surface S of the conductive substrate 102 first, with the recess region Q filled by the blanket seed crystal layer 104. It should be noted that, in this embodiment, the blanket seed crystal layer 104 is bent or curved along with shapes of the recess region Q and the second region R2, rather than filling up the entire recess region Q, as shown in FIG. 2B. A method for forming the blanket seed crystal layer 104 may be a sputtering method; however, the invention is not limited to this. In other embodiments, other methods may be employed to form the blanket seed crystal layer 104.

Figure 2C:
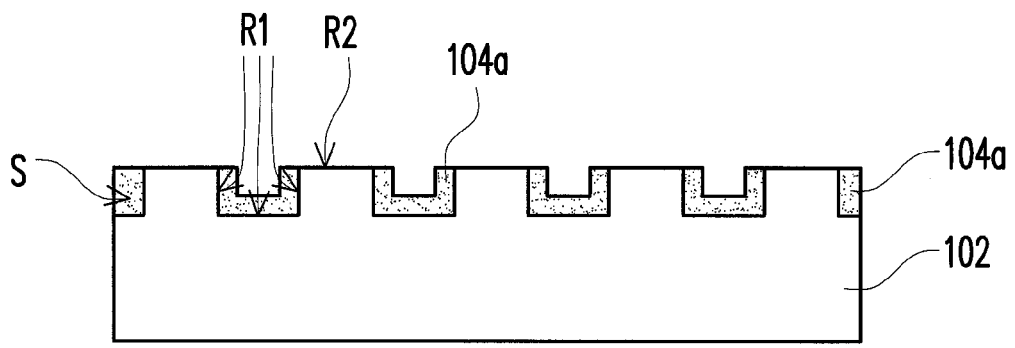

Then, a top portion of the blanket seed crystal layer 104 is removed, so as to expose the second region R2 and form the patterned seed crystal layer 104a, as shown in FIG. 2C. For example, in this embodiment, a selective etching method may be employed to remove the top portion of the blanket seed crystal layer 104 so as to expose the second region R2 and form the patterned seed crystal layer 104a. However, the invention is not limited to this. In other embodiments, other methods may be employed to remove the top portion of the seed crystal layer 104.

Figure 2D:
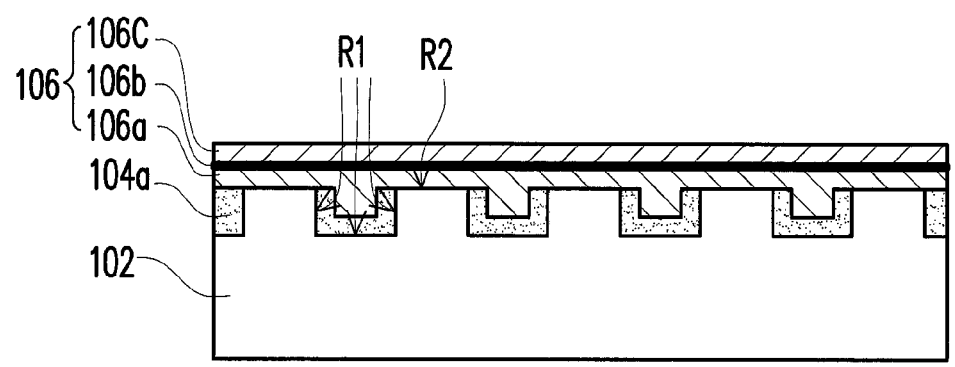

Then, referring to FIG. 2D, a semiconductor stacking layer 106 is formed on the conductive substrate 102 and the patterned seed crystal layer 104a, wherein the semiconductor stacking layer 106 covers the patterned seed crystal layer 104a and the second region R2, the patterned seed crystal layer 104a separates the first region R1 from the semiconductor stacking layer 106, and the semiconductor stacking layer 106 is electrically connected to the conductive substrate 102 through the second region R2.

Figure 2E:
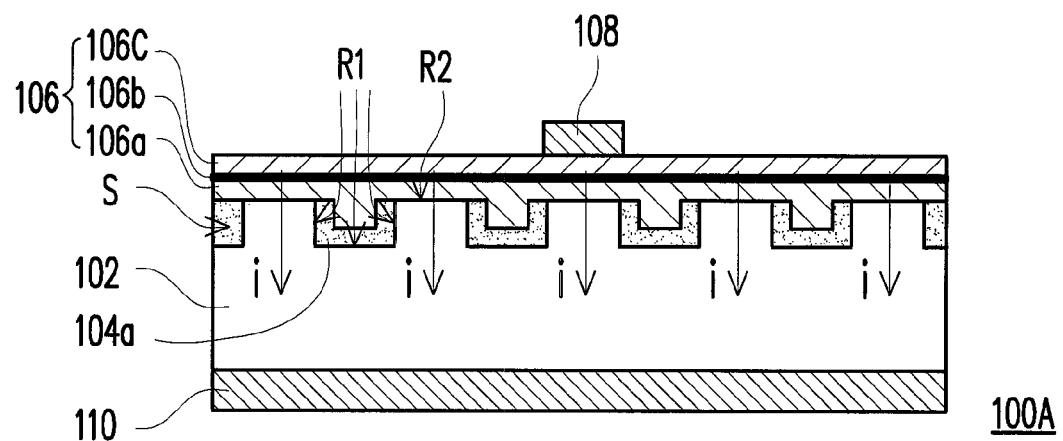

Similarly, referring to FIG. 2E, the fabrication method of the LED chip structure 100A of this embodiment may further include forming a first electrode 108 on the semiconductor stacking layer 106, wherein the semiconductor stacking layer 106 is disposed between the first electrode 108 and the conductive substrate 102. In this manner, the LED chip structure 100A of this embodiment can enable the light-emitting layer 106b in the semiconductor stacking layer 106 to emit light through the first electrode 108 and the second region R2 of the conductive substrate 102. A second electrode 110 may also be formed on the conductive substrate 102, wherein the surface S of the conductive substrate 102 faces away from the second electrode 110, so that the LED chip structure 100A of this embodiment can be driven through the first electrode 108, the second electrode 110, and the second region R2 of the conductive substrate 102, thereby achieving better optical properties of the LED chip structure 100A of this embodiment. Then, the LED chip structure 100A of this embodiment is completed.

Third Embodiment

FIGS. 3A to 3F are schematic sectional views illustrating a fabrication process of an LED chip structure 100B according to a third embodiment of the invention. The LED chip structure 100B and the fabrication process thereof in this embodiment are similar to the LED chip structure 100 and the fabrication process thereof in the first embodiment, and thus like elements are indicated by like reference numerals. Hereinafter, differences between the two embodiments are illustrated, and the similarities will not be described again.

Figure 3A:
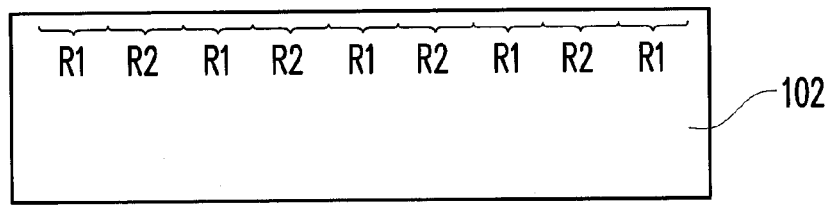
FIGS. 3A to 3F are schematic views illustrating a fabrication process of an LED chip structure according to a third embodiment of the invention.

Referring to FIG. 3A, first, a conductive substrate 102 is provided, wherein the conductive substrate 102 has a surface S, the surface S has a first region R1 and a second region R2, and the first region R1 and the second region R2 are alternately distributed over the surface S.

Figure 3B:
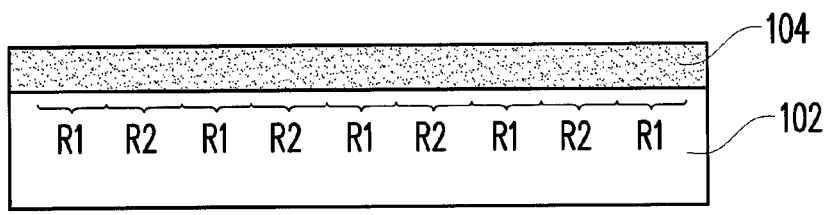
Figure 3C:
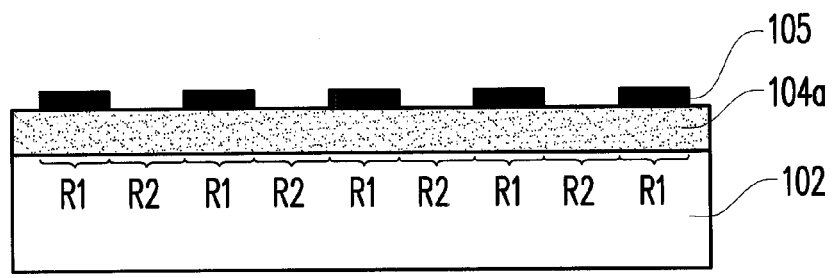
Figure 3D:
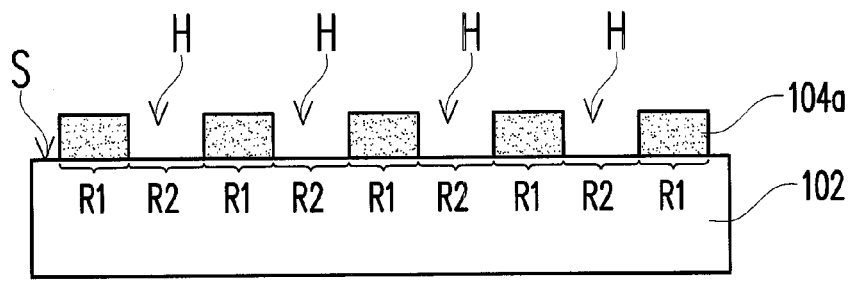

Then, a patterned seed crystal layer 104a is formed on the first region R1, with the second region R2 exposed by the patterned seed crystal layer 104a. For example, a blanket seed crystal layer 104 may be formed on the surface S of the conductive substrate 102 first, as shown in FIG. 3B. Then, the blanket seed crystal layer 104 is selectively etched, so as to expose the second region R2 and form the patterned seed crystal layer 104a. Specifically, a photoresist layer 105 may be formed on a part of the region of the seed crystal layer 104 corresponding to the first region R1, as shown in FIG. 3C; next, the blanket seed crystal layer 104 is etched; then, the photoresist layer 105 is removed, so as to form the patterned seed crystal layer 104a, as shown in FIG. 3D. It should be noted that, the patterned seed crystal layer 104a of this embodiment protrudes from the surface S of the conductive substrate 102, and the patterned seed crystal 104a has a plurality of gaps H.

Figure 3E:
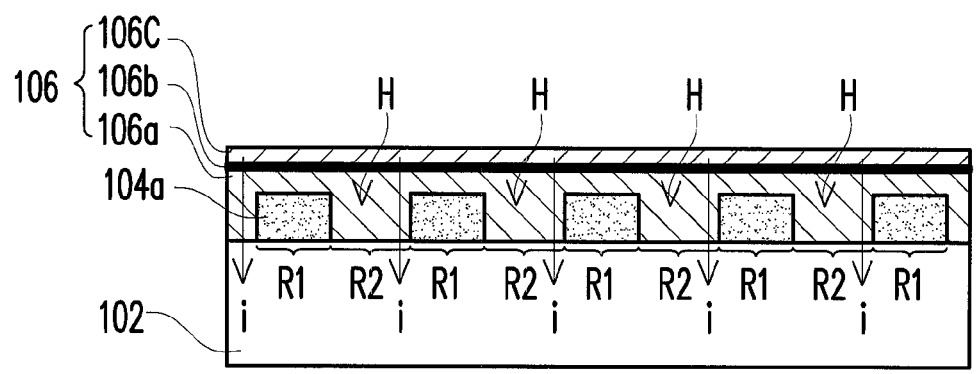

Then, referring to FIG. 3E, a semiconductor stacking layer 106 is formed on the conductive substrate 102 and the patterned seed crystal layer 104a, wherein the semiconductor stacking layer 106 covers the patterned seed crystal layer 104a and the second region R2, the patterned seed crystal layer 104a separates the first region R1 from the semiconductor stacking layer 106, and the semiconductor stacking layer 106 is electrically connected to the conductive substrate 102 through the second region R2. In this embodiment, the semiconductor stacking layer 106 fills the gaps H of the protruding patterned seed crystal layer 104a.

Figure 3F:
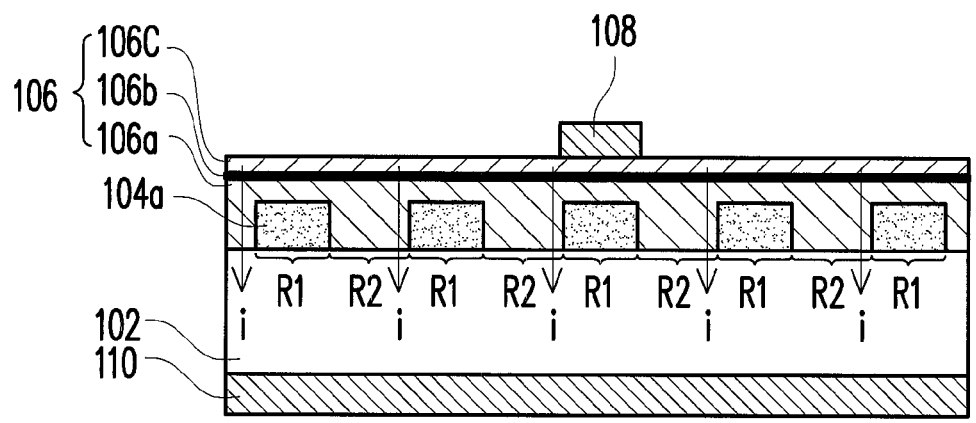

Similarly, referring to FIG. 3F, the fabrication method of the LED chip structure 100B of this embodiment may further include forming a first electrode 108 on the semiconductor stacking layer 106, wherein the semiconductor stacking layer 106 is disposed between the first electrode 108 and the conductive substrate 102. In this manner, the LED chip structure 100B of this embodiment can enable the light-emitting layer 106b in the semiconductor stacking layer 106 to emit light through the first electrode 108 and the conductive substrate 102. A second electrode 110 may also be formed on the conductive substrate 102, wherein the surface S of the conductive substrate 102 faces away from the second electrode 110, so that the LED chip structure 100B of this embodiment can be driven through the first electrode 108, the second electrode 110, and the conductive substrate 102, thereby achieving better optical properties of the LED chip structure 100B of this embodiment. Then, the LED chip structure 100B of this embodiment is completed.

In conclusion, the LED chip structure according to the embodiment of the invention employs the patterned seed crystal layer, and the semiconductor stacking layer is grown from the patterned seed crystal layer, and therefore, the LED chip structure has good epitaxial quality; meanwhile, the semiconductor stacking layer can be electrically connected to the conductive substrate through the second region. In this manner, the LED chip structure of this embodiment does not need a temporary substrate in the prior art to perform epitaxy, and the step of transferring and attaching the seed crystal layer and the semiconductor stacking layer to the conductive substrate can be omitted. In addition, the laser lift-off process technology having high technical thresholds is not needed to lift off the temporary substrate. Therefore, the fabrication cost of the LED chip structure of this embodiment is dramatically reduced. In addition, the fabrication method of the LED chip structure of this embodiment is simple, which facilitates improving a fabrication yield of the LED chip structure.

In addition, since the patterned seed crystal layer does not completely cover the surface of the conductive substrate, and exposes the second region to enable the semiconductor stacking layer to be electrically connected to the conductive substrate, a current in the LED chip structure is not overly concentrated, and thereby the LED chip structure has good optical properties and is unlikely to have the problem that the heating region is overly concentrated.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light-emitting diode (LED) chip structure, comprising:
   a conductive substrate, having a surface, wherein the surface has a first region and a second region, and the first region and the second region are alternately distributed over the surface;
   a semiconductor stacking layer, disposed on the conductive substrate, wherein the surface of the conductive substrate faces the semiconductor stacking layer; and
   a patterned seed crystal layer, disposed on the first region of the surface of the conductive substrate and between the conductive substrate and the semiconductor stacking layer, wherein the patterned seed crystal layer separates the first region from the semiconductor stacking layer, and exposes the second region, and the semiconductor stacking layer covers the patterned seed crystal layer and the second region, and is electrically connected to the conductive substrate through the second region.

2. The LED chip structure according to claim 1, wherein the first region is a recess region, and the patterned seed crystal layer is embedded in the recess region.

3. The LED chip structure according to claim 2, wherein the patterned seed crystal layer fills up the recess region.

4. The LED chip structure according to claim 1, wherein the first region is a recess region, and the patterned seed crystal layer is bent or curved along with a surface shape of the recess region.

5. The LED chip structure according to claim 1, wherein the patterned seed crystal layer protrudes from the surface of the conductive substrate, and the semiconductor stacking layer fills gaps of the protruding patterned seed crystal layer.

6. The LED chip structure according to claim 1, wherein a material of the patterned seed crystal layer is an insulating material.

7. The LED chip structure according to claim 1, wherein the semiconductor stacking layer comprises:

a first doped type semiconductor layer, disposed on the conductive substrate and covering the patterned seed crystal layer and the second region;

a light-emitting layer, disposed on the first doped type semiconductor layer; and a second doped type semiconductor layer, disposed on the light-emitting layer.

8. The LED chip structure according to claim 1, further comprising:

a first electrode, disposed on the semiconductor stacking layer, wherein the semiconductor stacking layer is disposed between the first electrode and the conductive substrate; and a second electrode, disposed on the conductive substrate, wherein the conductive substrate is disposed between the second electrode and the semiconductor stacking layer.

9. A fabrication method of a light-emitting diode (LED) chip structure, comprising:

providing a conductive substrate, wherein the conductive substrate has a surface; the surface has a first region and a second region, and the first region and the second region are alternately distributed over the surface;

forming a patterned seed crystal layer on the first region, with the second region exposed by the patterned seed crystal layer; and forming a semiconductor stacking layer on the conductive substrate and the patterned seed crystal layer, wherein the semiconductor stacking layer covers the patterned seed crystal layer and the second region, the patterned seed crystal layer separates the first region from the semiconductor stacking layer, and the semiconductor stacking layer is electrically connected to the conductive substrate through the second region.

10. The fabrication method of the LED chip structure according to claim 9, wherein the step of providing the conductive substrate comprises selectively etching the conductive substrate, and obtaining by etching a recess region on the conductive substrate to form the first region.

11. The fabrication method of the LED chip structure according to claim 10, wherein the step of forming the patterned seed crystal layer on the first region with the second region exposed by the patterned seed crystal layer comprises:

forming a blanket seed crystal layer on the surface of the conductive substrate, with the recess region filled by the blanket seed crystal layer; and removing a top portion of the blanket seed crystal layer, so as to expose the second region and form the patterned seed crystal layer.

12. The fabrication method of the LED chip structure according to claim 11, wherein the blanket seed crystal layer fills up the entire recess region.

13. The fabrication method of the LED chip structure according to claim 11, wherein the blanket seed crystal layer is bent or curved along with shapes of the recess region and the second region.

14. The fabrication method of the LED chip structure according to claim 9, wherein the step of forming the patterned seed crystal layer on the first region with the second region exposed by the patterned seed crystal layer comprises:

forming a blanket seed crystal layer on the surface of the conductive substrate; and selectively etching the blanket seed crystal layer, so as to expose the second region and form the patterned seed crystal layer.

15. The fabrication method of the LED chip structure according to claim 14, wherein the patterned seed crystal later protrudes from the surface of the conductive substrate.

16. The fabrication method of the LED chip structure according to claim 9, wherein the step of forming the semiconductor stacking layer comprises:

forming a first doped type semiconductor layer on the conductive substrate, with the patterned seed crystal layer and the second region covered by the first doped type semiconductor layer;

forming a light-emitting layer on the first doped type semiconductor layer; and forming a second doped type semiconductor layer on the light-emitting layer.

17. The fabrication method of the LED chip structure according to claim 9, further comprising:

forming a first electrode on the semiconductor stacking layer, wherein the semiconductor stacking layer is disposed between the first electrode and the conductive substrate; and forming a second electrode on the conductive substrate, wherein the surface of the conductive substrate faces away from the second electrode.

18. The fabrication method of the LED chip structure according to claim 9, wherein a material of the patterned seed crystal layer is an insulating material.

* * * * *